US008664068B2

(12) United States Patent
Hoentschel et al.

(10) Patent No.: US 8,664,068 B2
(45) Date of Patent: Mar. 4, 2014

(54) LOW-DIFFUSION DRAIN AND SOURCE REGIONS IN CMOS TRANSISTORS FOR LOW POWER/HIGH PERFORMANCE APPLICATIONS

(75) Inventors: Jan Hoentschel, Dresden (DE); Stefan Flachowsky, Dresden (DE); Steven Langdon, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 242 days.

(21) Appl. No.: 13/192,620

(22) Filed: Jul. 28, 2011

(65) Prior Publication Data
US 2012/0153399 A1    Jun. 21, 2012

(30) Foreign Application Priority Data
Dec. 16, 2010 (DE) .......................... 10 2010 063 292

(51) Int. Cl.
*H01L 21/336* (2006.01)
*H01L 21/36* (2006.01)

(52) U.S. Cl.
USPC .................... 438/300; 438/229; 257/E21.435; 257/E21.619; 257/E21.634

(58) Field of Classification Search
CPC ....................... H01L 29/7848; H01L 26/66636
USPC ................... 438/198, 229, 300; 257/E21.435, 257/E21.619, E21.634
See application file for complete search history.

(56) References Cited

U.S. PATENT DOCUMENTS

| 2006/0065937 A1 * | 3/2006 | Hoffmann et al. ........... 257/401 |
| 2006/0226476 A1 | 10/2006 | Suenaga ...................... 257/338 |
| 2007/0126036 A1 * | 6/2007 | Ohta et al. ................... 257/288 |
| 2008/0251851 A1 | 10/2008 | Pan et al. ..................... 257/369 |
| 2009/0001413 A1 | 1/2009 | Gauthier, Jr. et al. ........ 257/190 |
| 2009/0191679 A1 | 7/2009 | Ouyang et al. .............. 438/276 |
| 2009/0294860 A1 | 12/2009 | Mowry et al. ............... 257/368 |
| 2010/0078689 A1 | 4/2010 | Kronholz et al. ............ 257/288 |
| 2010/0197092 A1 * | 8/2010 | Kim et al. ................... 438/229 |
| 2010/0224937 A1 * | 9/2010 | Sridhar ......................... 257/369 |
| 2011/0121315 A1 * | 5/2011 | Ohta et al. ...................... 257/77 |
| 2011/0312145 A1 * | 12/2011 | Tsai et al. .................... 438/300 |

FOREIGN PATENT DOCUMENTS

| DE | 102008047127 A1 | 12/2009 | ............ H01L 21/336 |
| DE | 102008049733 B3 | 6/2010 | ............ H01L 21/336 |

OTHER PUBLICATIONS

Translation of Official Communication from German Patent Office for German Patent Application No. 10 2010 063 292.2 dated Jul. 20, 2011.

* cited by examiner

*Primary Examiner* — Jerome Jackson, Jr.
*Assistant Examiner* — Paul Budd
(74) *Attorney, Agent, or Firm* — Amerson Law Firm, PLLC

(57) ABSTRACT

The drain and source regions may at least be partially formed by in situ doped epitaxially grown semiconductor materials for complementary transistors in sophisticated semiconductor devices designed for low power and high performance applications. To this end, cavities may be refilled with in situ doped semiconductor material, which in some illustrative embodiments also provides a desired strain in the channel regions of the complementary transistors.

19 Claims, 4 Drawing Sheets

LOW-DIFFUSION DRAIN AND SOURCE REGIONS IN CMOS TRANSISTORS FOR LOW POWER/HIGH PERFORMANCE APPLICATIONS

BACKGROUND OF THE INVENTION

1. Field of the Invention

Generally, the present disclosure relates to integrated circuits, and, more particularly, to transistors of high performance for low power applications, such as digital circuit portions and the like.

2. Description of the Related Art

Advanced integrated circuits include a large number of circuit elements on a given chip area according to a specified circuit layout, wherein transistors, such as field effect transistors, represent an important component that is used as switching element, as current and/or voltage amplifier and the like. In sophisticated applications requiring high performance, the transistors are formed in and above substantially crystalline semiconductor regions that are formed at specified substrate locations to act as active regions, that is, to act, at least temporarily, as conductive areas for creating a controlled current flow. To this end, the active regions are modified by incorporating dopant species in order to adapt the electronic characteristics, for instance by providing PN junctions. Generally, a plurality of process technologies are currently practiced, wherein, for complex circuitry, such as micro-processors, storage chips and the like, CMOS technology is one of the most promising approaches due to the superior characteristics in view of operating speed and/or power consumption and/or cost efficiency. During the fabrication of complex integrated circuits using, for instance, CMOS technology, millions of transistors, e.g., N-channel transistors and P-channel transistors, are formed on a substrate including a crystalline semiconductor layer. A transistor, irrespective of whether an N-channel transistor or a P-channel transistor or any other transistor architecture is considered, comprises PN junctions that are formed by an interface of highly doped regions, such as drain and source regions, with a lightly doped or non-doped region, such as a channel region, disposed adjacent to the highly doped regions. In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of the MOS transistors. Thus, the scaling of the channel length, and associated therewith the reduction of channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. For example, highly sophisticated dopant profiles, in the vertical direction as well as in the lateral direction, are required in the drain and source regions so as to provide low sheet and contact resistivity in combination with a desired channel controllability in order to counter so-called short channel effects, such as drain-induced barrier lowering and the like. In addition, the vertical location of the PN junctions with respect to the gate insulation layer also represents a critical design criterion in view of leakage current control, as reducing the channel length also requires reducing the depth of the drain and source regions with respect to the interface formed by the gate insulation layer and the channel region, thereby calling for sophisticated implantation techniques.

In sophisticated field effect transistors, for instance, the dopant profiles of the drain and source regions require sophisticated implantation techniques in which highly doped yet shallow profiles may be provided so as to connect to the channel region, wherein such shallow doped regions are referred to as drain and source extension regions. Furthermore, deep drain and source regions are required with a high dopant concentration and with increased lateral offset from the channel region in order to provide an appropriately shaped electrical field in transistors having an extremely short channel length. Moreover, typically counter-doped regions or halo regions have to be provided at a certain depth and at or below the channel region in order to appropriately adjust essential transistor characteristics, such as threshold voltage and the like. During the corresponding implantation processes, the gate electrode structure is used as an implantation mask, thereby ensuring the self-aligned positioning of the complex drain and source regions. To this end, the gate electrode structures typically comprise a corresponding spacer structure, whose width may be appropriately selected for the implantation process under consideration, for instance the extension and halo implantation and the implantation of the deep drain and source regions, thereby also requiring sophisticated patterning strategies in highly sophisticated semiconductor devices. That is, in current cutting-edge devices used for low power applications, i.e., for applications operated at supply voltages of approximately 10 volts and significantly less, high performance transistors may be used with a gate length of 50 nm and significantly less, such as 30 nm and less, wherein, in densely packed device areas, the lateral space between the densely packed gate electrode structures may be of similar order of magnitude. Consequently, any structural irregularities or process non-uniformities, which may be introduced during the complex process of patterning the gate electrode structures and the corresponding spacer elements, may significantly affect the resulting dopant profile. Moreover, implantation-induced damage in the active regions of the transistors typically require sophisticated anneal processes, which may be associated with a certain degree of dopant diffusion, which in turn results in dopant fluctuations and thus in significant transistor variability. Moreover, recently additional mechanisms for enhancing performance of sophisticated field effect transistors have been implemented, which aim at increasing the charge carrier mobility in the channel regions for a given channel length, thereby potentially achieving a performance improvement that is comparable with the advance to further reduced overall device dimensions, while avoiding many of the above-described problems involved with extremely small critical dimensions. For example, the lattice structure in respective semiconductor regions, such as the channel region, may be modified, for instance by creating tensile or compressive strain therein, which thus results in a modified mobility of electrons and holes, respectively. For example, creating uniaxial tensile strain in the channel region of a field effect transistor with respect to the current flow direction increases the mobility of electrons, which in turn may directly translate into a corresponding increase of transistor performance. On the other hand, compressive strain in the channel region may increase the mobility of holes, thereby providing the potential for enhancing performance of P-type transistors. In advanced CMOS devices, therefore, an efficient mechanism has been implemented on the basis of a highly stressed dielectric material formed above the transistors, wherein the dielectric material with high internal compressive stress is positioned above P-channel transistors and dielectric material with high internal tensile stress is positioned above N-channel transistors. This very efficient mechanism, however, becomes increasingly less effective since the reduced space between laterally adjacent gate electrode structures increasingly imposes significant restrictions to the deposition processes, which are used for forming the highly stressed dielectric material and for patterning the same.

In other strategies, a gain in performance of P-channel transistors is achieved by selectively incorporating a strain-inducing silicon/germanium alloy in the active region after patterning the gate electrode structures so that the silicon/germanium alloy induces a compressive strain in the adjacent channel region. Although generally this mechanism provides an efficient strategy for enhancing performance of P-channel transistors, lattice-induced damage in the silicon/germanium alloy and different diffusion conditions with respect to the silicon base material may also increasingly influence the finally obtained performance gain and may also affect the variability of the transistor characteristics.

Consequently, although many advanced process strategies have been implemented into the process flow for fabricating sophisticated field effect transistors for low power applications, the transistor characteristics and in particular the characteristics of the drain and source regions obtained on the basis of implantation processes and associated anneal techniques, in particular in combination with superior performance enhancing mechanisms, may no longer be compatible with a further reduction of critical dimensions of the semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which deep drain and source regions of sophisticated complementary transistors may be provided on the basis of an in situ doped semiconductor material, that is, on the basis of a semiconductor material that may be grown on the basis of epitaxial growth techniques while simultaneously incorporating the desired type and concentration of one or more dopant species. Consequently, in this manner, a highly controlled incorporation of the dopant species may be accomplished without requiring sophisticated anneal processes in order to activate the dopant species and to re-crystallize implantation-induced damage. The in situ doped semiconductor material may be formed in appropriate cavities provided in the active regions, wherein basically the size and shape of the deep drain and source regions may thus be defined on the basis of the size and shape of the cavities. In some illustrative embodiments disclosed herein, the in situ doped semiconductor material may be provided as a strain-inducing semiconductor material, at least for one type of transistor, thereby even further contributing to superior transistor performance due to the superior strain conditions in the corresponding channel region.

One illustrative method disclosed herein relates to forming complementary transistors. The method comprises forming first deep drain and source regions by forming a first crystalline semiconductor material in first cavities that are located in a first active region laterally adjacent to a first gate electrode structure. The first deep drain and source regions are formed by a first epitaxial growth process, wherein the first crystalline semiconductor material comprises a first drain and source dopant species. Furthermore, the method comprises forming second deep drain and source regions by forming a second crystalline semiconductor material in second cavities that are located in a second active region laterally adjacent to a second gate electrode structure. The second crystalline semiconductor material is formed by a second epitaxial growth process, thereby incorporating a second drain and source dopant species that differs from the first drain and source dopant species. Additionally, the method comprises forming first drain and source extension regions in the first active region and forming second drain and source extension regions in the second active region.

A further illustrative method disclosed herein relates to forming drain and source regions of complementary transistors. The method comprises forming first drain and source extension regions in a first active region and forming second drain and source extension regions in a second active region. The method further comprises performing an anneal process so as to activate dopant species of the first and second drain and source extension regions. Moreover, first cavities are formed in the first active region and second cavities are formed in the second active region after forming the first and second drain and source extension regions. The method further comprises forming a first in situ doped semiconductor material in the first cavities so as to connect to the first drain and source extension region. Moreover, the method comprises forming a second in situ doped semiconductor material in the second cavities so as to connect to the second drain and source extension regions, wherein the first and second in situ doped semiconductor materials are of inverse conductivity type.

One illustrative semiconductor device disclosed herein comprises a P-channel transistor. The P-channel transistor comprises a first gate electrode structure formed above a first channel region and first drain and source regions that comprise first drain and source extension regions that are formed laterally adjacent to the first channel region. The first drain and source regions further comprise first deep drain and source regions that are formed of a first doped strain-inducing semiconductor alloy. The semiconductor device further comprises an N-channel transistor. The N-channel transistor comprises a second gate electrode structure formed above a second channel region and comprises second drain and source regions, which in turn comprise second drain and source extension regions that are formed laterally adjacent to the second channel region. The second drain and source regions further comprise second deep drain and source regions formed of a second doped strain-inducing semiconductor alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
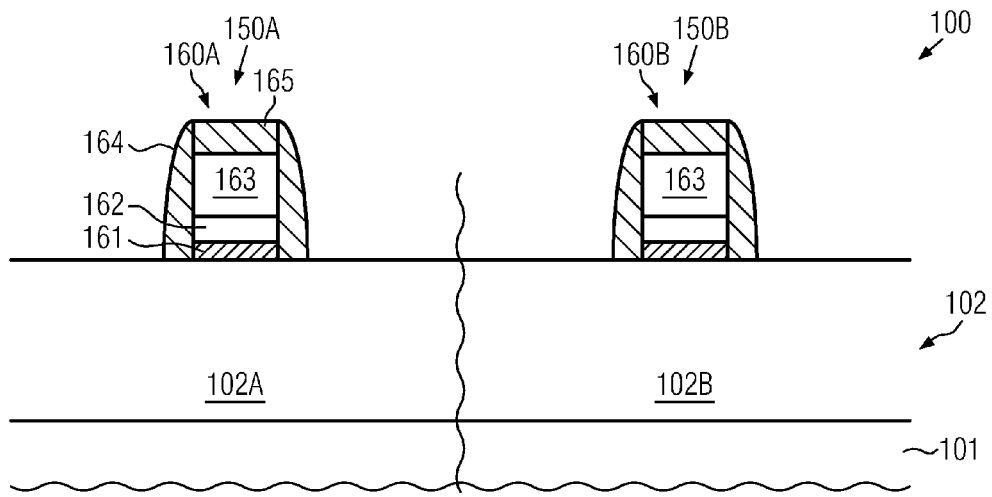
FIGS. 1a-1h schematically illustrate cross-sectional views of a semiconductor device during various manufacturing stages in forming sophisticated planar field effect transistors on the basis of superior drain and source regions having reduced fluctuations, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques and semiconductor devices in which superior drain and source dopant profiles may be implemented on the basis of an in situ doped semiconductor material in order to incorporate the dopant species for P-channel transistors and N-channel transistors with a significantly reduced total diffusion compared to conventional strategies, in which deep drain and source regions are formed on the basis of implantation techniques. As previously discussed, the conventional incorporation of the deep drain and source areas based on implantation processes may result in significant lattice damage, which may thus lead to increased charge carrier scattering and a reduction of the internal strain of semiconductor alloys, which may be implemented into the active region in order to provide superior strain conditions in the channel region of the transistors. Thus, according to the principles disclosed herein, the required type of dopant species and its concentration at the various height levels within the active region may be precisely controlled on the basis of an epitaxial growth process, thereby also positioning a significant part of the incorporated dopant species at the desired lattice sites. Consequently, the further processing, if desired, may be continued without actually requiring any anneal processes for re-crystallizing the implantation-induced damage, which may conventionally be associated with a certain degree of dopant diffusion, which in turn may result in corresponding variations of the deep drain and source regions. In some illustrative embodiments, if required, a further increase of the overall activation of the implanted dopant species may be achieved by applying anneal processes based on laser radiation, flashlight and the like, in which typically a pronounced dopant diffusion is suppressed, while nevertheless short distance movements may be initiated so as to increase the number of dopant species that are actually positioned at lattice sites. Consequently, the lateral and vertical profile of the dopant species incorporated during the epitaxial growth process may be substantially preserved and may thus result in a well defined-electronic behavior of the transistor under consideration. On the other hand, a shallow doped area, for instance in the form of drain and source extension regions, may be provided in an early manufacturing stage on the basis of a less critical spacer structure by means of ion implantation with a subsequent appropriate anneal process, such as a laser-based anneal process or flashlight-based process, thereby also achieving a high degree of dopant activation without significantly contributing to a pronounced dopant diffusion. In this case, undue lattice damage may be significantly less compared to the implantation of the deep drain and source regions and corresponding damaged regions may also be substantially removed when forming the corresponding cavities for incorporating the in situ doped semi-conductor material. Hence, also the drain and source extension regions may be provided with a reduced thermal budget, i.e., with a reduced diffusion activity, wherein any implantation-induced damage may not substantially contribute to a deterioration of the transistor characteristics. Similarly, the relatively low dose incorporation of a counter-doped region or halo region may be accomplished on the basis of implantation techniques, for instance, applied in combination with the drain and source extension implantation or after forming the cavity and prior to growing the in situ doped semiconductor material. Hence, the counter-doped region may be positioned with superior accuracy without unduly affecting the further process, i.e., the incorporation of the in situ doped semiconductor material.

In some illustrative embodiments, the in situ doped semiconductor material may be provided in the form of a semiconductor material having a different natural lattice constant with respect to the semiconductor base material of the transistors under consideration, thereby providing superior strain conditions, at least for one type of transistor. For example, as discussed above, incorporating an atomic species having a covalent radius that is greater than the covalent radius of silicon may result in an increased lattice constant, thereby resulting in a compressive strain component in the channel region that is laterally enclosed by the semiconductor alloy. For example, germanium, tin and the like may be efficiently incorporated into the silicon base material in order to provide a high compressive strain component. Similarly, an atomic species having a reduced covalent radius compared to silicon, such as carbon, may be efficiently used for forming a semiconductor material that induces a tensile strain in the adjacent channel region. In this manner, depending on the overall crystalline configuration of the silicon base material, the mobility of holes and electrons may be efficiently increased.

Since the in situ doping may eliminate the necessity for any further implantation processes, the high crystalline quality of the strain-inducing material may be preserved so that generally the degree of charge carrier scattering may be reduced, which may significantly contribute to the overall enhanced transistor performance.

Furthermore, the in situ doping of the semiconductor material incorporated for forming the deep drain and source areas may also be advantageously combined with sophisticated process strategies, in which superior gate electrode structures are provided. To this end, a high-k dielectric material may be incorporated into the gate dielectric layers of the gate electrode structures in order to provide superior capacitive coupling while not unduly increasing the gate leakage currents. It should be appreciated that a high-k dielectric material is to be understood as any dielectric material, i.e., an insulating material, having a dielectric constant of 10.0 and higher. For example, certain metal oxides, such as hafnium oxide, zirconium oxide, aluminum oxide or any other metal compounds, may be efficiently used as a high-k dielectric material. Furthermore, in some cases, the high-k dielectric material may be provided in combination with a conventional dielectric material, for instance in terms of interface characteristics and the like, wherein the conventional dielectric material may be provided with a layer thickness of 1 nm and less, followed by a high-k dielectric material of appropriate thickness. Furthermore, in any such sophisticated gate electrode structures, also the usually used semiconductor electrode materials, such as amorphous or polycrystalline silicon, silicon/germanium and the like, may be replaced, at least partially, with a metal-containing conductive material, which may also be used for adjusting the appropriate work function of the gate electrode structure under consideration. The high-k dielectric material and the metal-containing electrode material may be provided in an early manufacturing stage, i.e., upon patterning the gate electrode structures, so that the adjustment of the work function and thus threshold voltage of the transistor may be achieved upon forming the gate electrode structures. In other cases, one or more materials of the initially patterned gate electrode structures may be replaced with other material or material systems in a very advanced manufacturing stage.

FIG. 1a schematically illustrates a cross-sectional view of a semiconductor device 100 comprising a substrate 101 and a semiconductor layer 102. The substrate 101 may represent any appropriate carrier material, as may typically be used for forming sophisticated semiconductor devices. For example, the substrate 101 may represent a silicon substrate and the like. Similarly, the semiconductor layer 102 may represent any appropriate crystalline material, at least in an initial state, in and above which circuit elements, such as transistors 150A, 150B, are to be formed. For example, the semiconductor layer 102 may represent a silicon base material, a silicon/germanium material and the like, depending on the overall requirements for the further processing of the device 100. In some illustrative embodiments, the substrate 101 and the semiconductor layer 102 may form a bulk configuration in which the semiconductor layer 102 may be in direct contact with a crystalline material of the substrate 101. In other embodiments (not shown), a buried insulating material (not shown) may be formed between the substrate 101 and the semiconductor layer 102, if a silicon-on-insulator (SOI) configuration is considered appropriate for one or both of the transistors 150A, 150B. The semiconductor layer 102 may comprise a plurality of active regions, which are to be understood as semiconductor regions in and above which at least one transistor is to be formed. For convenience, a first active region 102A and a second active region 102B are illustrated in FIG. 1a, wherein the regions 102A, 102B may be positioned laterally adjacent to each other, possibly in combination with an isolation region (not shown), while in other cases any other device areas of circuit elements may be formed between the regions 102A, 102B, depending on the overall device and design requirements. In some illustrative embodiments, the transistors 150A, 150B may represent complementary transistors, i.e., the transistor 150A may be of inverse conductivity type compared to the transistor 150B. For example, the transistor 150A may be an N-channel transistor while the transistor 150B may represent a P-channel transistor.

Moreover, in the manufacturing stage shown, a first gate electrode structure 160A may be formed on the active region 102A and may comprise a gate dielectric layer 161, an electrode material 163 and a dielectric cap material 165, which, in combination with a first spacer or spacer structure 164, may confine the materials 163 and 161. Similarly, a second gate electrode structure 160B may be formed on the active region 102B and may comprise substantially the same components as the gate electrode structure 160A. The gate electrode structures 160A, 160B may have a gate length, i.e., in FIG. 1a the horizontal extension of the electrode material 163, of 50 nm and significantly less, for instance 30 nm and less, wherein also a lateral distance between adjacent gate electrode structures may be on the order of magnitude of 100 nm and less, depending on the specific layout of the device 100.

As previously explained, in some illustrative embodiments, the gate electrode structures 160A, 160B may be provided in the form of sophisticated high-k metal gate electrode structures or these electrode structures may be converted into such sophisticated gate electrode structures in a further advanced manufacturing stage. In the embodiment shown, the gate dielectric layer 161 may comprise a high-k dielectric material, for instance in the form of hafnium oxide and the like, wherein, in some cases, a conventional silicon oxide-based dielectric material may also be provided in the layer 161, thereby obtaining a desired thickness and capacitive coupling of the gate electrode structures with respect to the under-lying active regions. Furthermore, in the embodiment shown, a metal-containing electrode material 162 may be formed above the gate dielectric material 161 and below the electrode material 163, which may be provided in the form of a semiconductor-based material. The material 162 may be provided in the form of a substantially temperature stable conductive material, such as titanium nitride, which may also provide a desired work function, possibly in combination with a specific work function metal species, such as lanthanum, aluminum and the like. In other cases, any such work function adjusting species may be incorporated in the layer 161 and/or in the layer 162. It should be appreciated that typically different metal species may be used for the gate electrode structures 160A and 160B since different work functions may be required in order to obtain the desired threshold voltages of the transistors 150A, 150B.

The semiconductor device 100 as illustrated in FIG. 1a may be formed on the basis of the following processes. After laterally delineating any active regions in the layer 102, for instance by forming corresponding isolation structures (not shown), the basic transistor characteristics may be adjusted, for instance by incorporating an appropriate well dopant species and the like. To this end, if desired, implantation techniques may be applied in combination with appropriate masking regimes, wherein any implantation-induced damage may be less significant due to the moderately low implantation dose used. Thereafter, appropriate materials may be provided, for instance by oxidation, deposition and the like, in order to provide the layers 161, possibly in combination with the layers 162. It should be appreciated that the dielectric material 161 may also be provided as a conventional dielectric material, such as silicon oxynitride having a thickness of 2 nm and less in sophisticated applications, without incorporating a high-k dielectric material. In this case, typically a polysilicon electrode material may be formed on the gate dielectric material 161, while in other cases, as for instance shown in FIG. 1*a*, the material 161 may be provided in the form of a conventional dielectric material and a high-k material, followed by one or more material layers for adjusting a desired work function. To this end, anneal processes may be applied so as to initiate the diffusion of a desired work function species into the material 161, wherein typically respective approaches are applied in order to individually adjust the electronic characteristics for the gate electrode structures 160A, 160B, respectively. In other cases, dedicated metal layers may be deposited in order to adjust the work function individually for the electrode structures 160A, 160B. In this case, any such specific work function metal layers may be incorporated in the layers 162. Thereafter, the semiconductor base material 163 may be deposited, followed by the deposition of any further material layers, such as a material or material system for the cap layer 165, which may then be used, in combination with any further sacrificial materials, to provide an appropriate lithography mask and pattern the resulting layer stack. To this end, sophisticated lithography processes, such as double exposure-double etch strategies, may be applied. In some illustrative embodiments, the cap material 165 may comprise a silicon dioxide layer, which may be removed in later manufacturing stages on the basis of well-established highly selective wet chemical etch chemistries, such as hydrofluoric acid. In other cases, the cap layer 165 may comprise a silicon nitride material, possibly in combination with one or more additional liners, depending on the overall process strategy. Similarly, the spacer or spacer structure 164 may be formed by depositing any appropriate spacer material, such as silicon nitride, silicon dioxide and the like, in order to confine the materials 161, 162. In other cases, when well-established silicon oxynitride/polysilicon configurations are used, the confinement of the gate electrode structures 160A, 160B may be less critical. Thus, after the deposition of the one or more spacer materials, appropriate etch techniques may be applied so as to obtain the spacer or spacer structure 164 having an appropriate width so as to comply with the requirements for the further processing, for instance in terms of providing a lateral offset and the like.

Figure 1B:
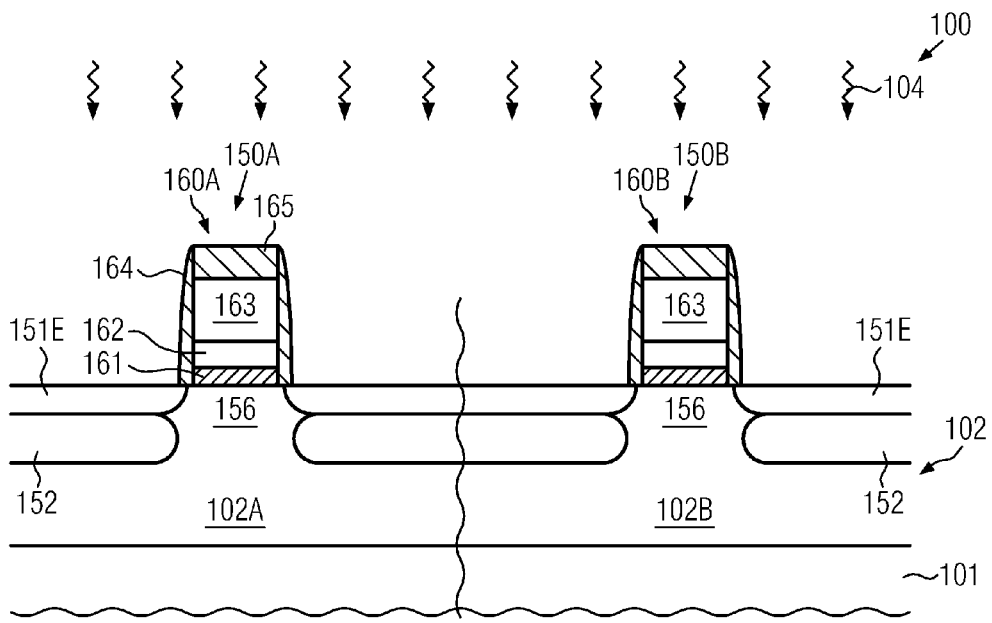

FIG. 1*b* schematically illustrates the semiconductor device 100 in a further advanced manufacturing stage. As illustrated, drain and source extension regions 151E are formed in the active regions 102A, 102B, respectively. The extension regions 151E are to be understood as moderately highly doped regions, which are positioned at and near the surface of the active regions 102A, 102B, respectively. It should be appreciated that the extension regions 151E of the transistor 150A may be provided in the form of an N-doped region or a P-doped region, depending on whether the transistor 150A represents an N-channel transistor or a P-channel transistor. On the other hand, the extension regions 151E of the transistor 150B represent shallow doped regions of inverse conductivity type with respect to the extension regions 151E of the transistor 150A, when these transistors represent complementary transistors. Moreover, in the embodiment shown, corresponding counter-doped regions 152 are formed in the active regions 102A, 102B, wherein the term counter-doped is to be understood with respect to the conductivity type of the associated drain and source extension regions 151E. The counter-doped regions or halo regions 152 may thus be provided in order to appropriately adjust certain transistor characteristics, such as threshold voltage and the like. The extension regions 151E and the halo regions 152 may be formed on the basis of implantation processes in which one of the transistors 150A, 150B may be covered with an implantation mask, such as a resist mask (not shown), while the other transistor is exposed to an ion bombardment performed on specific implantation parameters, such as energy and dose, wherein the non-covered respective gate electrode structure including the spacer structure 164 may act as an implantation mask. Thus, the spacer structure 164 may substantially define the lateral offset of the extension regions 151E, thereby basically defining the length of a channel region 156. Similarly, the size and position of the halo regions 152 may be defined on the basis of implantation parameters, such as dose, energy and tilt angle, if the lateral distance between the halo regions 152 is to be reduced. It should be appreciated that generally the halo regions 152 are provided on the basis of a significantly lower implantation dose compared to the moderately highly doped extension regions 151E. Thereafter, the corresponding implantation mask may be removed and a further mask may be formed, followed by an appropriate implantation sequence for incorporating the dopant species for the extension regions 151E and the halo regions 152 of the other transistor. Next, an anneal process 104 may be applied in order to activate the previously incorporated dopant species, which may be accomplished in some illustrative embodiments on the basis of sophisticated implantation techniques that may substantially avoid undue dopant diffusion. For example, laser-based anneal techniques, flashlight-based anneal techniques and the like may be applied, in which generally high temperatures are induced in the active regions 102A, 102B for a very short time interval so that, if desired, dopant diffusion may be substantially suppressed. On the other hand, significant lattice damage may be avoided in deeper areas of the active regions 102A, 102B due to the reduced penetration depth of the extension species and the moderately low dose used for forming the halo regions 152.

Figure 1C:
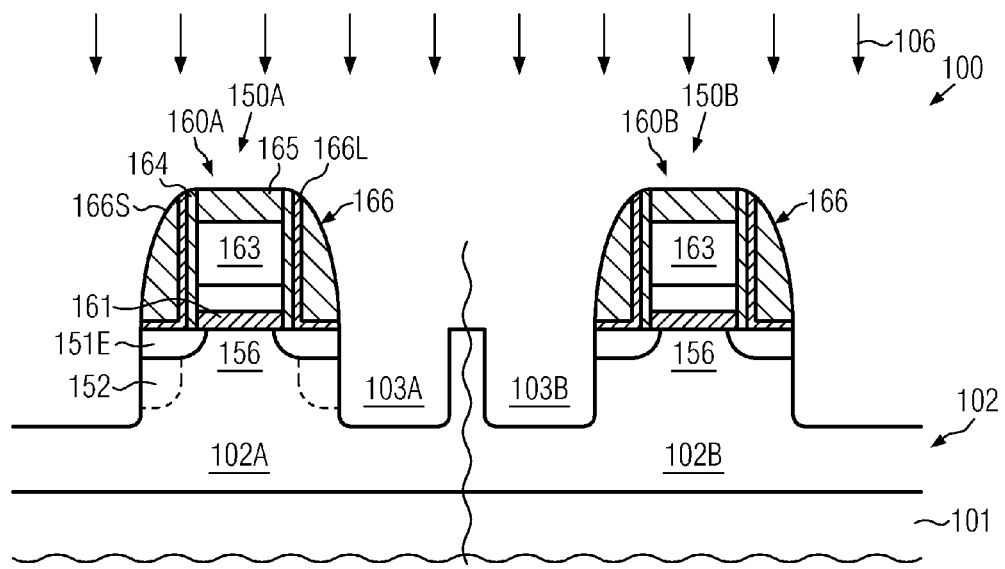

FIG. 1*c* schematically illustrates the semiconductor device 100 in a further advanced manufacturing stage in which a further spacer or spacer structure 166 may be provided in the gate electrode structures 160A, 160B. In the embodiment shown, the spacer structure 166 may comprise an etch stop liner 166L in combination with a spacer element 166S, while the previously formed spacer 164 may still be in place. Furthermore, cavities 103A may be formed in the active region 102A laterally adjacent to the gate electrode structure 160A, which comprises the spacer structure 166. Similarly, cavities 103B may be provided in the active region 102B laterally adjacent to the gate electrode structure 160B, which also comprises the spacer structure 166.

The spacer structure 166 may be formed on the basis of any appropriate process technique, for instance by depositing the liner material 166L, followed by the deposition of a spacer layer, which may then be etched so as to obtain the spacer element 166S. For example, the liner material 166L may be provided in the form of a silicon oxide material, a silicon nitride material, while the spacer 166S may be comprised of silicon nitride, silicon dioxide and the like. In some illustrative embodiments, a spacer etch process 106 may be applied, which may also be used for forming the cavities 103A, 103B, as shown in FIG. 1*c*. To this end, any appropriate plasma assisted etch recipes may be applied, as are well established for etching silicon material selectively with respect to silicon nitride and silicon dioxide. During the etch process 106, the process parameters may also be appropriately controlled in order to define the size and shape of the cavities 103A, 103B. For example, a substantially rectangular configuration may be obtained with a specific depth of the cavities 103A, 103B, which may be adjusted by controlling the etch time and the like. Thereafter, a further etch step may be performed, for instance, on the basis of an isotropic etch chemistry in order to provide a desired degree of under-etching, when the shape of the cavities 103A, 103B is considered inappropriate for obtaining a desired shape and size of deep drain and source regions to be formed in the cavities 103A, 103B.

Figure 1D:
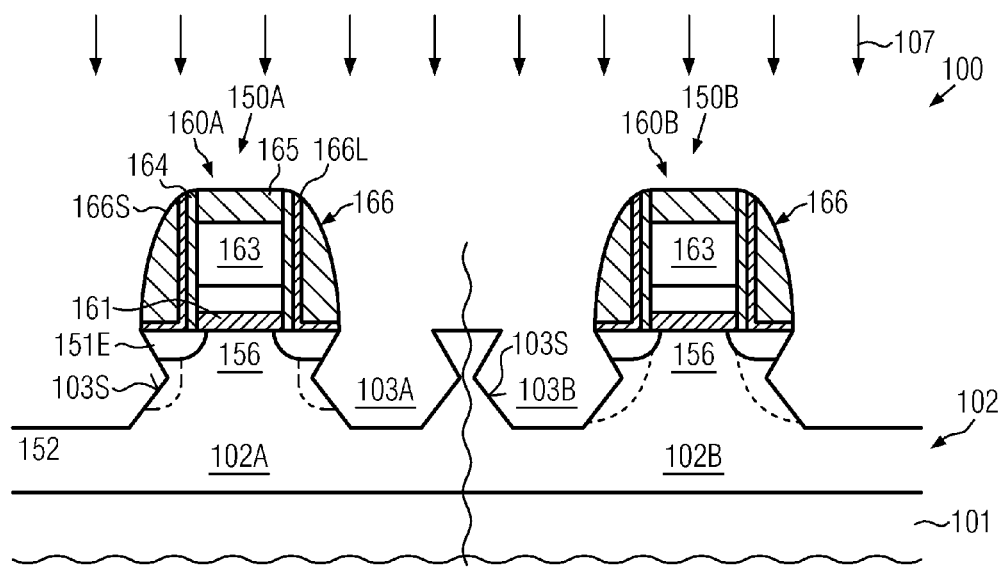

FIG. 1d schematically illustrates the semiconductor device 100 during a further etch step 107 in which a crystallographically anisotropic etch recipe is applied. To this end, a plurality of wet chemical etch recipes are available, for instance using TMAH (tetra methyl ammonium hydroxide), which may have a different etch rate for different lattice planes. Thus, depending on the basic crystallographic configuration of the active regions 102A, 102B, certain crystal planes, such as (111) planes, may act as etch stop planes, thereby providing highly controllable adjustment of the size and shape of the cavities 103A, 103B. For example, precisely inclined sidewall areas 103S, at least at the side towards the channel region 156, may be accomplished during the etch process 107. It should be appreciated that the shape obtained during the etch step 107 may also depend on the size and shape of the cavities 103A, 103B obtained after the etch process 106 of FIG. 1c. For example, by selecting the initial depth of the cavities 103A, 103B, a substantially triangular shape or a substantially sigma-shaped configuration, as shown in FIG. 1d, may be achieved. Consequently, upon appropriately controlling the etch processes 106, 107, a desired size and shape of the cavities 103A, 103B may be adjusted.

Figure 1E:
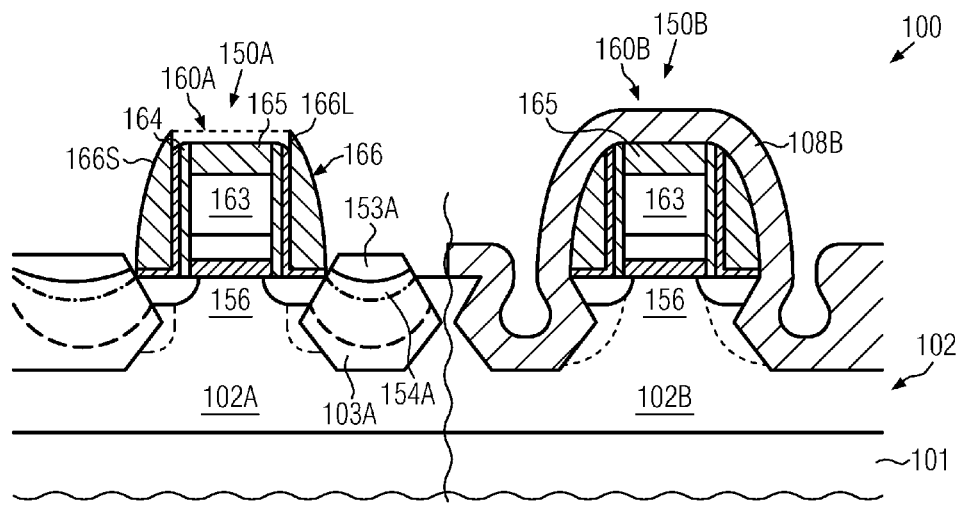

FIG. 1e schematically illustrates the semiconductor device 100 in a further advanced manufacturing stage. As illustrated, an in situ doped semiconductor material 153A is formed in the active region 102A, wherein the size and shape of the material 153A may basically be determined by the previously formed cavities 103A (FIG. 1d). In some illustrative embodiments, the material 153A may represent a strain-inducing semiconductor material, which may be formed in a strained state so as to induce a desired type of strain in the channel region 156. For example, the material 153A may be provided as a silicon/carbon mixture when a tensile strain component is desired for enhancing performance of the transistor 150A. Moreover, a certain concentration and profile of a dopant species, as indicated by 154A, may be incorporated in the material 153A so that the material 153A may represent deep drain and source regions of the transistor 150A. It should be appreciated that the concentration of the dopant species 154A may vary, for instance in the lateral and vertical direction, depending on the device requirements.

The in situ doped semiconductor material 153A and thus the deep drain and source regions of the transistor 150A may be formed on the basis of the following process strategy. Starting from the configuration as shown in FIG. 1d, a mask material may be deposited, for instance in the form of an oxide material and the like, followed by a lithography process for patterning the layer so as to preserve a portion 108B, which may thus cover the transistor 150B, while exposing the transistor 150A. During the patterning of the mask material to obtain the mask 108D, also a portion of the cap layer 165 may be removed, if for instance similar materials may be used for the cap layer 165 and the mask 108B. In other cases, these materials may have very different etch characteristics and thus the patterning of the mask 108B may be accomplished without a significant material removal in the cap layer 165 of the gate electrode structure 160A. Next, appropriate cleaning processes may be performed in order to prepare the transistor 150A for the deposition of the material 153A. Thereafter, selective epitaxial etch recipes may be applied in order to grow the material 153A, wherein the desired dopant species may be incorporated into the deposition atmosphere in order to obtain a desired degree of doping. The dopant concentration and its variation may be efficiently controlled by adjusting, for instance, the flow rate of a corresponding precursor material of the dopant species. For example, phosphorous, arsenic and the like may be incorporated for an N-type material. On the other hand, a significant deposition of the material 153A on dielectric surface areas may be suppressed. Furthermore, in some illustrative embodiments, the deposition parameters may be adjusted such that superior deposition may be obtained at the bottom of the cavities 103A, while a deposition of the material on crystal planes formed at the inclined surface areas 103S (FIG. 1d) may be less pronounced, thereby obtaining a superior bottom-to-top fill behavior. In this manner, a very efficient graded dopant profile may be obtained in the material 153A. After the selective epitaxial growth process, the mask 108B may be removed, for instance based on hydrofluoric acid and the like, depending on the material composition of the layer 108B. In this case, also the remaining portion of the layer 165 in the gate electrode structure 160A may be removed if comprised of silicon dioxide. Thereafter, a further mask material may be deposited and may be patterned so as to cover the transistor 150A.

Figure 1F:
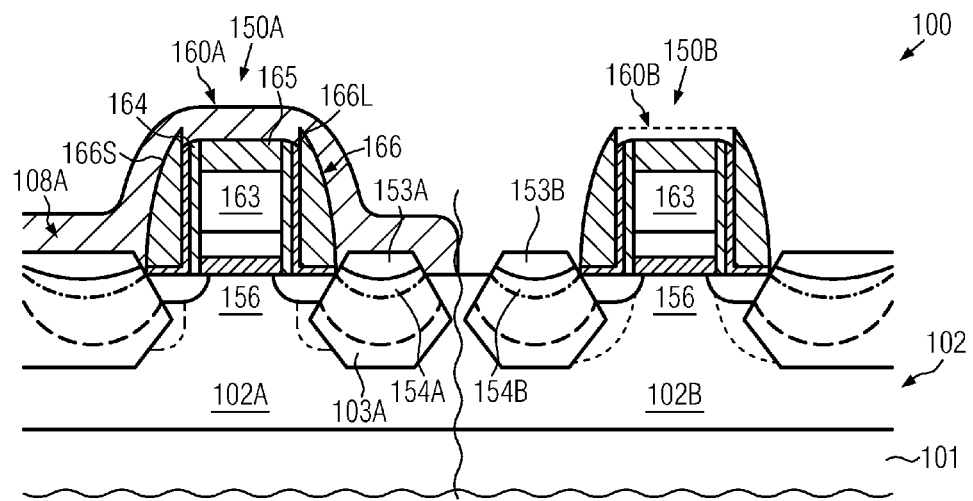

FIG. 1f schematically illustrates the semiconductor device 100 with a mask layer 108a formed above the transistor 150A, while the transistor 150B is exposed. Moreover, as illustrated, an in situ doped semiconductor material 153B and thus deep drain and source regions are provided in the active region 102B, wherein a corresponding dopant species, indicated by 154B, may have any desired concentration profile. For example, a substantially constant dopant concentration or a graded dopant concentration, as illustrated in FIG. 1f, may be formed, which may be accomplished by controlling process parameters during the selective epitaxial growth process, as is also discussed above with reference to the material 153A in FIG. 1e. For example, a P-type dopant species, such as boron, boron fluoride and the like, may be incorporated during the deposition of the material 153B. Moreover, in some illustrative embodiments, the material 153B may be provided in the form of a strain-inducing material, such as a silicon/germanium mixture and the like, when a high compressive strain in the transistor 150B is considered appropriate.

Figure 1G:
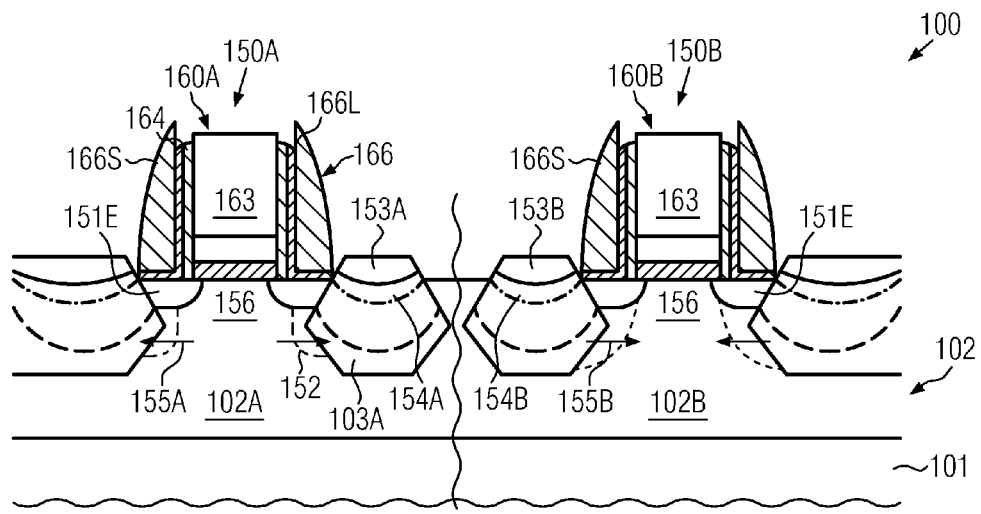

FIG. 1g schematically illustrates the semiconductor device 100 in a further advanced manufacturing stage in which the mask layer 108A of FIG. 1f is removed. Consequently, the transistor 150A comprises the deep drain and source regions 153A having a desired in situ doped concentration profile, which may connect to the extension regions 151E and which may result, in combination with the previously formed halo regions 152, in appropriately configured drain and source regions 153A for the transistor 150A. Moreover, in the embodiment shown, a desired strain 155A may be induced in the active region 102A by means of the incorporated material 153A. Similarly, the transistor 150B may comprise the deep drain and source regions 153B in the form of the in situ doped semiconductor material, which may thus exhibit any desired dopant concentration and concentration profile while, as shown, additionally a desired strain component 155B may be induced. Consequently, due to the epitaxial growth of the materials 153A, 153B, pronounced lattice damage may be avoided, as is for instance induced in conventional implantation-based strategies for forming deep drain and source regions, so that in particular any anneal processes designed to re-crystallize implantation-induced damage may be omitted. Consequently, the crystalline structure in the regions 153A, 153B may not suffer from implantation-induced damage and may thus provide superior strain conditions and may also reduce scattering-related performance losses. Moreover, the shape of the materials 153A, 153B may thus also define the position of any PN junctions substantially without any fluctuations, which conventionally may be associated with implantation processes and the required anneal processes, which may result in dopant diffusion.

In some illustrative embodiments, a superior degree of dopant activation may be achieved by additionally applying a short anneal process, such as a laser-based anneal process or a flashlight-based anneal process in which, as discussed above, a pronounced dopant diffusion may be suppressed. In other cases, however, the further processing may be continued without performing any high temperature process after providing the deep drain and source regions 153A, 153B.

Figure 1H:
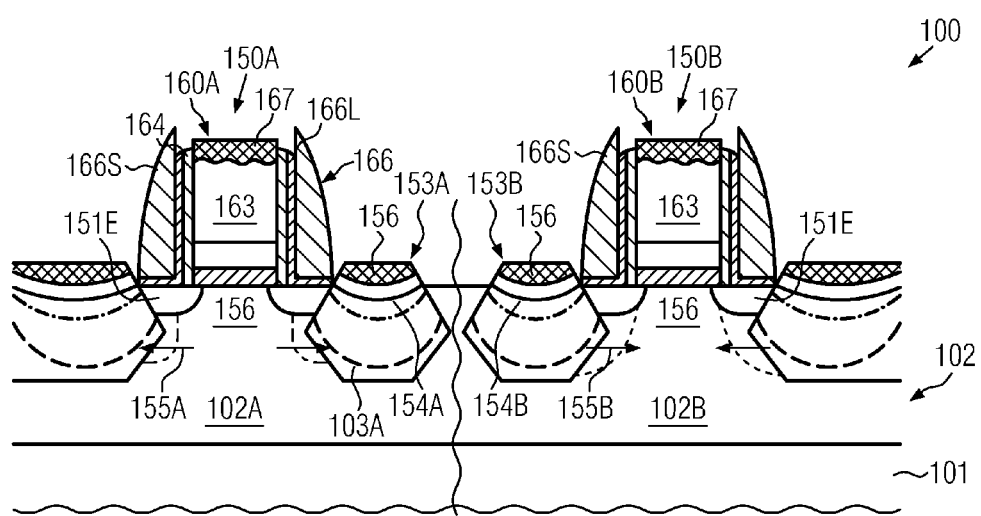

FIG. 1h schematically illustrates the semiconductor device 100 in a further advanced manufacturing stage. As illustrated, metal silicide or any other metal/semiconductor compound 156 may be formed in the drain and source regions 153A, 153B, which may be accomplished on the basis of the spacer structure 166 by using well-established silicidation strategies and the like. It should be appreciated that, if desired, the deep drain and source regions 153A, 153B may be provided with an appropriate material composition at the surface thereof in order to provide specific conditions upon performing the metal/semiconductor compound 156. For example, a high silicon concentration may be provided if a metal silicide is to be formed. Moreover, the dopant concentration may be appropriately adjusted so as to achieve a low contact resistance between the material 156 and the remaining semiconductor material. For example, a moderately abrupt step in the concentration may be provided, if considered appropriate. Moreover, in the embodiment shown, also a metal/semiconductor compound 167 may be formed in the gate electrode structures 160A, 160B, thereby further enhancing the overall electronic characteristics thereof. To this end, any well-established process strategies may be applied.

It should be appreciated that in other process strategies the metal/semiconductor compound 156, such as a metal silicide, may be formed in a later manufacturing stage, i.e., after providing an interlayer dielectric material and patterning the same so as to form contact openings therein, in which the metal/semiconductor compound 156 may be formed in exposed portions of the drain and source regions 153A, 153B. Furthermore, in still other illustrative embodiments, a portion of the gate electrode structures 160A, 160B may be replaced with other materials, such as highly conductive electrode metals, work function metal species, a high-k dielectric material and the like, for example upon providing a portion of the interlayer dielectric material and subsequently exposing a surface of the gate electrode structures 160A, 160B, through which selective removal processes may be applied, followed by the deposition of the one or more materials under consideration.

As a result, the present disclosure provides semiconductor devices and manufacturing techniques in which complementary transistors may be formed on the basis of a significantly reduced lateral and vertical diffusion of dopant species, while nevertheless providing, in particular, the dopant profiles of deep drain and source regions with superior precision by incorporating an in situ doped semiconductor material in highly controllably formed cavities. In this manner, the dopant species may be incorporated into the crystalline structure without inducing undue lattice damage and without requiring any subsequent anneal processes for re-crystallizing any damaged areas. Moreover, the in situ doped semiconductor material may be provided in the form of a strain-inducing material, thereby additionally enhancing performance of one or both types of complementary transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming complementary transistors, the method comprising:
   providing a semiconductor device comprising a first gate electrode structure comprising a first spacer structure, and a second gate electrode structure comprising a second spacer structure;
   forming first and second drain and source extension regions in first and second active regions using said first and second gate electrode structures comprising said first and second spacer structures as implantation masks, respectively;
   forming first counter-doped regions in said first active region and second counter-doped regions in said second active region prior to forming said first and second deep drain and source regions;
   thereafter forming first deep drain and source regions by forming a first crystalline semiconductor material in first cavities located in said first active region laterally adjacent to said first gate electrode structure by performing a first epitaxial growth process, said first crystalline semiconductor material comprising a first drain and source dopant species; and
   forming second deep drain and source regions by forming a second crystalline semiconductor material in second cavities located in said second active region laterally adjacent to a second gate electrode structure by performing a second epitaxial growth process, said second crystalline semiconductor material comprising a second drain and source dopant species that differs from said first drain and source dopant species.

2. The method of claim 1, wherein said first and second drain and source extension regions are formed prior to forming said first and second deep drain and source regions.

3. The method of claim 1, wherein said first and second counter-doped regions are formed after forming said first and second cavities.

4. The method of claim 1, wherein at least one of said first and second crystalline semiconductor materials is formed so as to induce strain.

5. The method of claim 1, wherein forming first and second deep drain and source regions comprises forming said first and second cavities by using a crystallographically anisotropic etch chemistry.

6. The method of claim 1, further comprising forming said first and second gate electrode structures so as to include a high-k dielectric material.

7. The method of claim 6, further comprising forming a metal-containing electrode material and a semiconductor electrode material in said first and second gate electrode structures prior to forming said first and second crystalline semiconductor materials.

8. The method of claim 1, wherein said first and second cavities are formed during the same etch sequence.

9. The method of claim 1, further comprising forming a first spacer on sidewalls of said first and second gate electrode structures and using said first spacer as an implantation mask when forming said first and second drain and source extension regions.

10. The method of claim 9, further comprising forming a second spacer adjacent to said first spacer and using said second spacer as an etch mask for forming said first and second cavities.

11. A method of forming drain and source regions of complementary transistors, the method comprising:
   providing a semiconductor device comprising a first transistor comprising a gate electrode structure comprising a first spacer structure and a second complementary transistor comprising a second gate electrode structure comprising a second spacer structure;
   while using said first transistor comprising said first spacer structure as a mask, forming first drain and source extension regions in a first active region;
   while using said second transistor comprising said second spacer structure as a mask, forming and second drain and source extension regions in a second active region;
   performing an anneal process so as to activate dopant species of said first and second drain and source extension regions;
   forming first cavities in said first active region and second cavities in said second active region after forming said first and second drain and source extension regions;
   forming a first in situ doped semiconductor material in said first cavities so as to connect to said first drain and source extension regions; and
   forming a second in situ doped semiconductor material in said second cavities so as to connect to said second drain and source extension regions, said first and second in situ doped semiconductor materials being of inverse conductivity type.

12. The method of claim 11, further comprising forming first counter-doped regions in said first active region and second counter-doped regions in said second active region.

13. The method of claim 12, wherein said first and second counter-doped regions are formed prior to forming said first and second cavities.

14. The method of claim 12, wherein said first and second counter-doped regions are formed after forming said first and second cavities.

15. The method of claim 11, further comprising forming a first gate electrode structure above said first active region and a second gate electrode structure above said second active region, wherein said first and second gate electrode structures comprise a high k dielectric material.

16. The method of claim 11, wherein said first and second cavities are formed by using at least one crystallographically anisotropic etch process.

17. The method of claim 11, wherein at least one of said first and second in situ doped semiconductor materials is provided as a strain-inducing material.

18. The method of claim 11 wherein forming said first cavities in said first active region and said second cavities in said second active region comprises performing the same etching process on said first and second active regions.

19. A method of forming complementary transistors, the method comprising:
   forming a first spacer on sidewalls of first and second gate electrode structures;
   using said first and second gate electrode structures comprising said first spacer as an implantation mask, forming first drain and source extension regions in said first active region and second drain and source extension regions in said second active region;
   forming a second spacer adjacent to said first spacer;
   using said first and second gate electrode structures comprising said first and second spacer as an etch mask, forming first deep drain and source regions by forming a first crystalline semiconductor material in first cavities located in a first active region laterally adjacent to a first gate electrode structure by a first epitaxial growth process, said first crystalline semiconductor material comprising a first drain and source dopant species; and
   also using said first and second gate electrode structures comprising said first and second spacer as an etch mask, forming second deep drain and source regions by forming a second crystalline semiconductor material in second cavities located in a second active region laterally adjacent to a second gate electrode structure by a second epitaxial growth process, said second crystalline semiconductor material comprising a second drain and source dopant species that differs from said first drain and source dopant species.

\* \* \* \* \*